(12) United States Patent
Faes et al.

(10) Patent No.: US 11,572,271 B2
(45) Date of Patent: Feb. 7, 2023

(54) METHOD FOR MANUFACTURING AN ETCH STOP LAYER AND MEMS SENSOR COMPRISING AN ETCH STOP LAYER

(71) Applicant: ams AG, Premstätten (AT)

(72) Inventors: Alessandro Faes, Premstatten (AT); Sophie Guillemin, Graz (AT); Joerg Siegert, Graz (AT); Karl Tuttner, Hofstatten an der Raab (AT)

(73) Assignee: AMS AG, Premstätten (AT)

( * ) Notice: Subject to any disclaimer, the term of this patent is extended or adjusted under 35 U.S.C. 154(b) by 0 days.

(21) Appl. No.: 17/056,201

(22) PCT Filed: May 8, 2019

(86) PCT No.: PCT/EP2019/061823
§ 371 (c)(1),
(2) Date: Nov. 17, 2020

(87) PCT Pub. No.: WO2019/219479
PCT Pub. Date: Nov. 21, 2019

(65) Prior Publication Data
US 2021/0214216 A1 Jul. 15, 2021

(30) Foreign Application Priority Data
May 18, 2018 (EP) ..................................... 18173267

(51) Int. Cl.
*B81C 1/00* (2006.01)

(52) U.S. Cl.
CPC ...... *B81C 1/00547* (2013.01); *B81C 1/00476* (2013.01); *B81C 1/00531* (2013.01);
(Continued)

(58) Field of Classification Search
None
See application file for complete search history.

(56) References Cited

U.S. PATENT DOCUMENTS

| 5,789,264 A | * | 8/1998 | Chung | ............... | G02B 26/0858 |
| | | | | | 438/52 |
| 6,203,715 B1 | * | 3/2001 | Kim | ................... | B81C 1/00174 |
| | | | | | 216/58 |

(Continued)

FOREIGN PATENT DOCUMENTS

EP 3650826 A1 5/2020

OTHER PUBLICATIONS

International Search Report and Written Opinion dated Jul. 23, 2019 in PCT Application No. PCT/EP2019/061823, 10 pages.
(Continued)

*Primary Examiner* — Jiong-Ping Lu
(74) *Attorney, Agent, or Firm* — MH2 Technology Law Group LLP

(57) ABSTRACT

The disclosure relates to a method for manufacturing a planarized etch-stop layer, ESL, for a hydrofluoric acid, HF, vapor phase etching process. The method includes providing a first planarized layer on top of a surface of a substrate, the first planarized layer having a patterned and structured metallic material and a filling material. The method further includes depositing on top of the first planarized layer the planarized ESL of an ESL material with low HF etch rate, wherein the planarized ESL has a low surface roughness and a thickness of less than 150 nm, in particular of less than 100 nm.

14 Claims, 7 Drawing Sheets

(52) U.S. Cl.
CPC ............... *B81C 2201/0104* (2013.01); *B81C 2201/014* (2013.01); *B81C 2201/0122* (2013.01); *B81C 2201/0132* (2013.01); *B81C 2201/053* (2013.01)

(56) References Cited

U.S. PATENT DOCUMENTS

| | | |
|---|---|---|
| 9,059,259 B2 | 6/2015 | Liou et al. |
| 9,659,864 B2 | 5/2017 | Wu et al. |
| 9,679,850 B2 | 6/2017 | Chen et al. |
| 9,726,561 B2 | 8/2017 | Besling et al. |
| 2004/0092059 A1 | 5/2004 | Ishikawa et al. |
| 2007/0057305 A1 | 3/2007 | Oates et al. |
| 2010/0320548 A1 | 12/2010 | Tsau et al. |
| 2014/0231937 A1* | 8/2014 | Losa ............... B81C 1/00801 257/415 |
| 2015/0022431 A1* | 1/2015 | Mahameed ........... G01P 15/125 310/300 |
| 2016/0023893 A1* | 1/2016 | Besling .............. B81C 1/00246 438/51 |
| 2016/0130140 A1 | 5/2016 | Losa et al. |

OTHER PUBLICATIONS

Taiwanese Examination Report (with English Translation) in Taiwanese Application No. 108115388 dated Aug. 23, 2022, 20 pages.
Taiwanese Office Action (with English Translation) in corresponding Taiwanese Application No. 1108115388 dated Nov. 17, 2022, 12 pages.

* cited by examiner

METHOD FOR MANUFACTURING AN ETCH STOP LAYER AND MEMS SENSOR COMPRISING AN ETCH STOP LAYER

CROSS-REFERENCE TO RELATED APPLICATIONS

The present application is the national stage entry of International Patent Application No. PCT/EP2019/061823, filed on May 8, 2019, which claims the benefit of priority of European Patent Application No. 18173267.8, filed on May 18, 2018, all of which are hereby incorporated by reference in their entirety for all purposes.

BACKGROUND OF THE INVENTION

The present disclosure relates to a method for manufacturing an etch stop layer, ESL, and to a microelectromechanical systems, MEMS, sensor comprising an ESL.

MEMS sensors are commonly employed in a wide range of applications such as automotive, consumer, industrial and medical, as well as many other applications. MEMS devices typically comprise a suspended object which is formed by removal of a sacrificial layer towards the end of the manufacturing process.

U.S. Pat. No. 9,340,412 B2 relates to a capacitive pressure sensor comprising a suspended membrane.

Suspending an object requires well-controlled etching in order to remove the sacrificial layer. Commonly, for suspending components of a MEMS device a sacrificial material subjacent to the component to be suspended is removed through hydrofluoric acid, HF, in particular through a HF vapor etch. Conventionally, it is critical to stop the etching process at a certain point, i.e. when the sacrificial material is entirely removed, in order to avoid unintended over-etching of other materials, for instance.

A common method is to use so-called etch stop layers, ESL, made of a material that is resistant or has a very low etch rate regarding a particular etchant. By suspending the etching process the ESL therefore provides protection to subjacent layers and materials.

The performance of an ESL can be negatively affected by existing topography of the subjacent layers and materials. For example, consequent topography of the etch stop layer allows for the formation of weak points in the ESL material through which subjacent materials can be accessed by means of an etchant.

SUMMARY OF THE INVENTION

This disclosure provides an improved concept of manufacturing an etch stop layer and a MEMS sensor comprising an etch stop layer.

The improved concept is based on the idea of planarizing the layers subjacent to the ESL before the deposition of the latter. This allows to have a thin ESL while avoiding any unwanted topography and consequent formation of weak points. In particular, for capacitive MEMS sensors a thin ESL is essential for maintaining the high sensitivity of the sensor, as the ESL typically remains on the finished product. Typically, during manufacturing the ESL is deposited on top of the structured bottom electrode and left behind. In particular, the thinner an ESL between an electrode pair, for example of a capacitive sensor, is, the less it influences electrical properties of the capacitor. In addition, the improved concept allows for the employment of the planarized ESL without the need for thermal processes at elevated temperatures, for example thermal processes of several hundred degrees Celsius.

In particular, the improved concept proposes a manufacturing method of forming a planarized etch stop layer for a hydrofluoric acid vapor phase etching process wherein the method comprises providing, on top of the surface of a substrate, a first planarized layer comprising a patterned and structured metallic material and a filling material. The method further comprises depositing on top of the first planarized layer a second planarized layer of an ESL material with low HF etch rate, wherein the second planarized layer is characterized by a low surface roughness and a thickness of less than 150 nm, in particular of less than 100 nm. For example, the surface roughness of the ESL is less than 10 nm, in particular less than 1 nm.

Typically, the metallic material forming the bottom electrodes of the capacitive sensor is composed of Ti, TiN, AlCu and/or TiTiN.

The improved concept further comprises a MEMS sensor manufactured following the manufacturing method according to the improved concept.

In various embodiments according to the improved concept, the method is part of a CMOS compatible fabrication process.

Combining a MEMS sensor with CMOS technology, for example by monolithically integrating the sensor with an integrated circuit, in particular in application specific integrated circuit, ASIC, systems with high accuracy and high sensitivity can be achieved that at the same time maintain a small form factor, low power consumption and reduced manufacturing costs.

In various embodiments of the method according to the improved concept, the material of the ESL is a semiconductor, such as silicon carbide, or a dielectric, such as silicon nitride, in particular silicon-rich silicon nitride.

Silicon carbide and silicon-rich silicon nitride are commonly available materials and characterized by very low etch rates regarding hydrofluoric acid etching. Therefore, these two materials constitute suitable choices regarding etch stop layers. In principle, any non-conductive CMOS-compatible material that is characterized by a low etch rate may be selected.

In at least one embodiment of the method according to the improved concept, the first planarized layer on the substrate is provided by depositing a first material on top of the surface of the substrate, patterning and structuring the first material, depositing a second material on top of the first material, in particular the structured first material, and exposed parts of the surface of the substrate, and performing planarization, for example chemical-mechanical planarization, CMP.

In variations of the embodiments described above, a CMP ESL material is arranged between the first material and the second material, in particular between the structured first material and the second material. The CMP ESL material is characterized by having a low CMP etch rate.

Moreover, in at least one variation of the embodiment, the CMP ESL material is the same as the ESL material.

In some cases an additional etch stop layer for the CMP etching process is necessary. The CMP ESL material may act as such an additional etch stop layer and may likewise be silicon nitride, in particular silicon-rich silicon nitride.

In some alternative embodiments of the method according to the improved concept, the first planarized layer on the substrate is provided by depositing a first material on top of a surface of the substrate, depositing a sacrificial material on top of the first material, patterning and structuring the first material and the sacrificial material, depositing a second material on top of the structured sacrificial material and exposed parts of the surface of the substrate and performing wet etching of the sacrificial material.

In variations of the embodiments described above, sidewalls of the structured sacrificial material are tapered.

In order for the removal of the sacrificial material together with the second material on top of the former, the so-called liftoff, to be successful, tapered sidewalls may be required. These tapered sidewalls may be achieved via a tapered plasma process and ensure that the sacrificial material remains suitable for a wet etch liftoff process. The sacrificial material may, for example, be a resist that remained after patterning and structuring the first material, or a sacrificial material deposited between the first material and a resist before patterning and structuring the first material.

In the embodiments described above, the first material is the metallic material and the second material is the filling material.

Alternatively, the first material is the filling material and the second material is the metallic material.

The forming of the first planarized layer on the surface of the substrate can either be realized by first defining the bottom electrodes made of the metallic material and subsequent filling of gaps in the metallic material layer with the filling material, or vice versa by patterning and structuring first the filling material before then depositing the metallic material to define the bottom electrodes.

In alternative embodiments of the method according to the improved concept, the first planarized layer on the substrate is provided by depositing, patterning and structuring the metallic material on top of the surface of the substrate, depositing the filling material on top of the structured metallic material and exposed parts of the surface of the substrate, depositing a planarized layer of a first material on top of the filling material and performing a process of non-selective plasma etching. The first material is hereby characterized by having a similar etch rate as the filling material concerning a non-selective plasma etch.

In contrast to the CMP process where a possible topography of the second material after deposition is not critical, for the non-selective plasma etching process the first material is deposited such that its top surface is planar. For example, the first material can be a resist which is deposited via spin-coating.

In various embodiments the method further comprises depositing a planarized sacrificial layer of a further material onto the planarized ESL, wherein the further material has a high HF etch rate compared to the ESL material, i.e. the further material has a high selectivity over the ESL material.

In at least one embodiment the further material is a dielectric, in particular silicon dioxide.

Silicon dioxide, $SiO_2$, is characterized by a high etch rate regarding HF etches, especially compared to silicon-rich SiN, preferred suitable material for the planarized ESL. This makes $SiO_2$ a suitable material for the sacrificial layer.

In at least one embodiment the further material is the same as the filling material.

To keep the manufacturing process as simple as possible, a short list of materials is maintained.

In various embodiments the method according to the improved concept further comprises forming a trench in the sacrificial layer, filling the trench with an anchor material, depositing, patterning and structuring a second metallic material on top of the sacrificial layer, removing the sacrificial layer and depositing a seal layer.

The second metallic material is composed of TiN and/or W and the material of the protective layer is SiN, for example. The seal layer is deposited onto the top electrode as well as the planarized ESL in order to protect the top electrode and also to serve as final passivation.

The aforementioned object is further solved by a capacitive MEMS sensor manufactured following the manufacturing method according to the improved concept, e.g. according to one of the embodiments described above. The sensor comprises a substrate, in particular a CMOS substrate, on top of which a first planarized layer is arranged. The first planarized layer comprises a structured metallic material and a filling material in voids of the structured metallic material. On top of the first planarized layer, a planarized ESL of an ESL material with low HF etch rate is arranged, wherein the planarized ESL has a low surface roughness and a thickness of less than 150 nm, in particular less than 100 nm. The sensor further comprises a suspended layer of a structured second metallic material above the ESL.

Further embodiments of the sensor become apparent to the skilled reader from the embodiments of the manufacturing method described above.

BRIEF DESCRIPTION OF THE DRAWINGS

The following description of figures of exemplary embodiments may further illustrate and explain aspects of the improved concept. Elements of the manufacturing method with the same structure and the same effect, respectively, appear with equivalent reference symbols. Insofar as elements of the method correspond to one another in terms of their function in different figures, the description thereof is not repeated for each of the following figures.

DETAILED DESCRIPTION

Figure 1A:
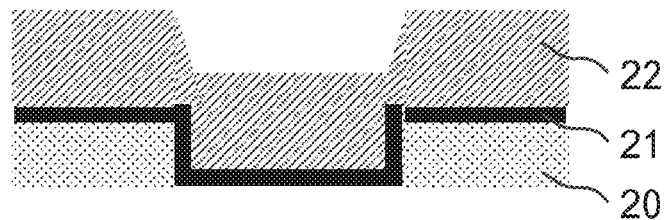
FIGS. 1A to 1C show an exemplary embodiment of the method according to the improved concept.
Figure 1B:
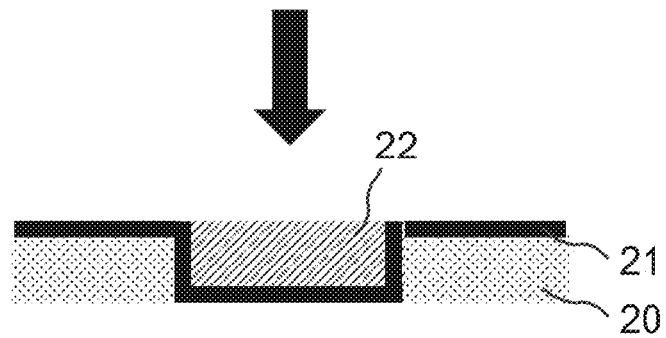
Figure 1C:
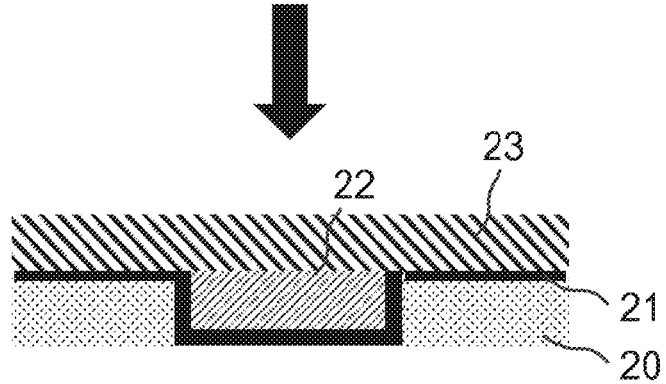

FIGS. 1A to 1C show an exemplary embodiment of the method to form a planarized etch-stop layer, ESL, for a hydrofluoric acid, HF, vapor phase etching process. In this exemplary embodiment, the planarization of the first layer is realized by chemical-mechanical planarization, CMP, for instance. The embodiment employs an additional ESL for CMP process.

As shown in FIG. 1A, the additional ESL is made of a CMP ESL material 21, which is deposited on top of exposed parts of a top surface of a substrate, not shown, and a structured first material. In this embodiment, the first material is a metallic material 20 which forms bottom electrodes. The CMP ESL material 21 may for example be SiN, in particular silicon-rich SiN and has a low etch rate regarding CMP etching. The metallic material 20 may for example be composed of Ti, TiN, AlCu and/or TiTiN. As a second material, a filling material 22 is deposited on top of the CMP ESL material 21, in particular to fill gaps in the layer comprising the metallic material 20. The filling material 22 may be a dielectric material, for example SiO2.

FIG. 1B shows a first planarized layer after performing CMP, which was suspended with reaching the additional ESL made off the CMP ESL material 21. As CMP aims at planarizing the surface it is applied to, a topography of the structure, in particular after deposition of the filling material 22 is not critical.

FIG. 1C shows the application of the ESL material 23 forming the intended planarized ESL on top of the planarized first layer. The ESL material 23 may be SiN, in particular silicon-rich SiN, which has a low etch rate regarding HF etchants. For some CMP processes, the employment of an additional ESL for the CMP may be optional.

Figure 2A:
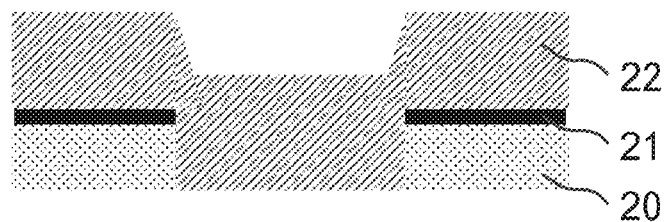
FIGS. 2A to 2C show a variation of the exemplary embodiment shown in FIGS. 1A to 1C.
Figure 2B:
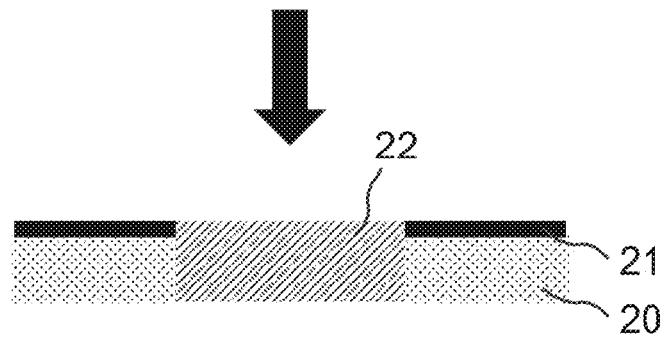
Figure 2C:
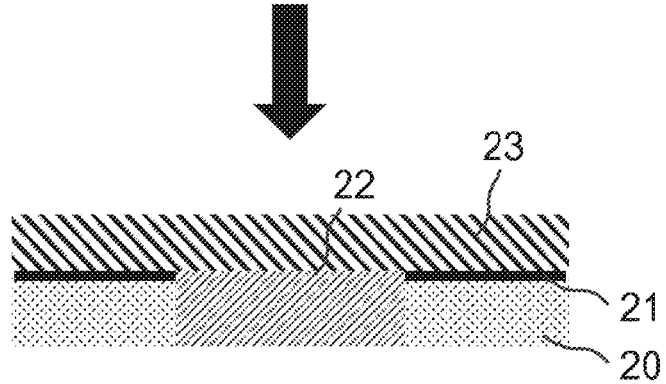

FIGS. 2A to 2C show a variation of the embodiment described in FIGS. 1A to 1C. In this variation, the CMP ESL material 21 is patterned and structured together with the metallic material 20 before depositing the filling material 22.

In particular, the CMP ESL material 21 may act as a mask, hence eliminating the necessity for a resist, for instance, to pattern and structure the metallic material 20 before applying the CMP ESL material 21, as shown in FIGS. 1A to 1C.

The CMP process also in this variation suspends with reaching the CMP ESL material 21 and therefore forms the first planarized layer, as shown in FIG. 2B.

FIG. 2C consequently shows the deposition of the ESL material 23 for the formation of the planarized ESL.

FIGS. 3A to 3D illustrate a variation of the process as an alternative embodiment of the method according to the improved concept. Compared to the embodiments described in FIGS. 1A to 1C and FIGS. 2A to 2C, the first material and the second material are exchanged.

Figure 3A:
FIGS. 3A to 3D show a further exemplary embodiment of the method according to the improved concept.

For this embodiment, the filling material 22 is deposited as the first material on a surface of the substrate and subsequently patterned and structured, as shown in FIG. 3A.

Figure 3B:
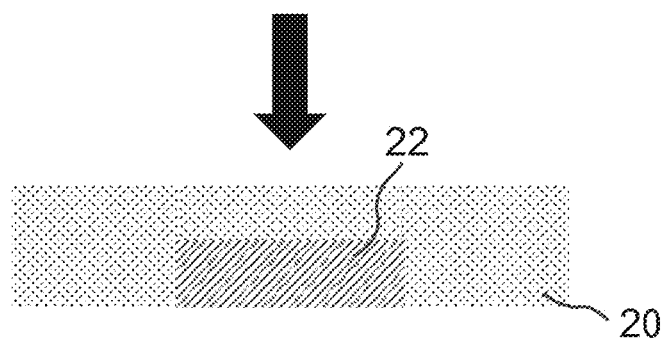

FIG. 3B shows the deposition of the metallic material 20 as the second material, defining bottom electrodes in the layer of the filling material 22.

Figure 3C:
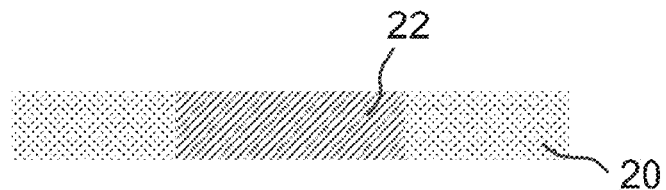

The filling material 22 can in this case be chosen to have a low etch rate regarding CMP, such that the planarization of the first layer suspends with reaching the filling material 22, as illustrated in FIG. 3C.

Figure 3D:
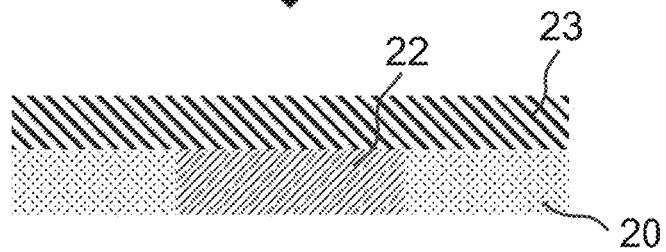

FIG. 3D shows the structure after depositing the ESL material 23 to form the planarized ESL.

Figure 4A:
FIGS. 4A to 4C show a further exemplary embodiment of the method according to the improved concept.
Figure 4A:
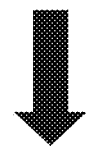
Figure 4B:
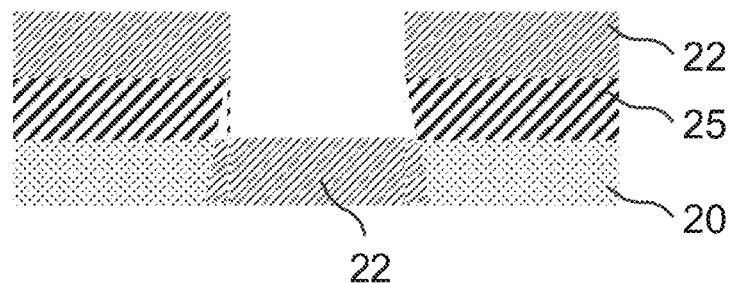
Figure 4B:
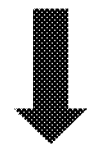
Figure 4C:
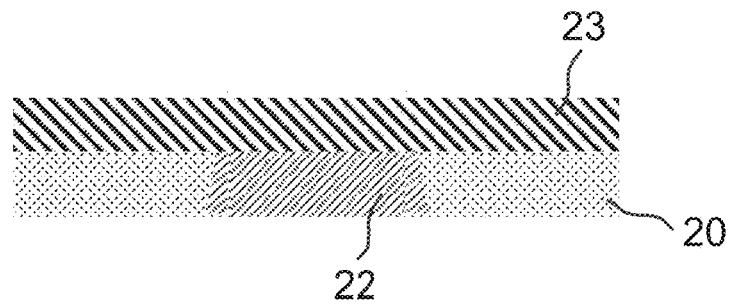

FIGS. 4A to 4C show an alternative embodiment of the method to form the planarized ESL on top of the planarized first layer.

In this embodiment, the metallic material 20 is patterned and structured as the first material together with a sacrificial material 25, as shown in FIG. 4A. The sacrificial material 25 may for example be a resist material that is not removed after structuring the metallic material 20. The patterning and structuring of the metallic material 20 and the sacrificial material 25 for example is realized via a tapered plasma process, in particular to achieve tapered sidewalls 26 of the sacrificial material 25.

FIG. 4B shows the deposition of the filling material 22 as the second material, which can be well-controlled in particular for filling gaps in the first layer comprising the metallic material 20, such that a thickness of the filling material 22 corresponds to the thickness of the metallic material 20.

FIG. 4C shows the result after removal of the sacrificial material 25 through a lift-off process, for instance, forming the planarized first layer as basis for the planarized ESL of the ESL material 23 on top of the first layer.

Figure 5A:
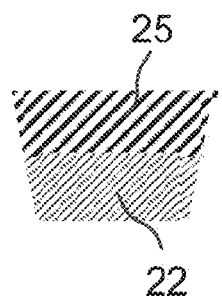
FIGS. 5A to 5C show a variation of the exemplary embodiment shown in FIGS. 4A to 4C.
Figure 5B:
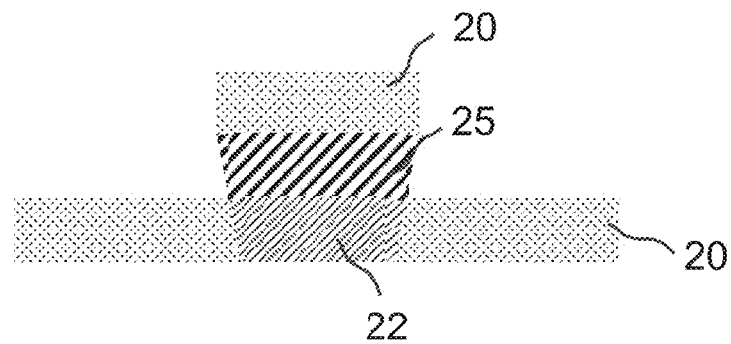
Figure 5C:
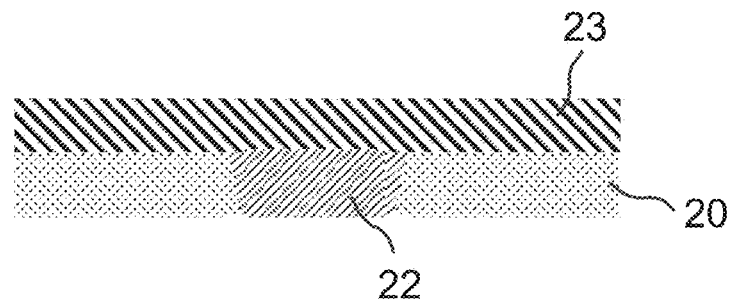

FIGS. 5A to 5C show a reversed process as alternative embodiment of the method shown in FIGS. 4A to 4C, in which the first material and the second material are exchanged.

The principle of this embodiment is analogous to the process shown in FIGS. 3A to 3D, wherein in a first step the filling material 22 is patterned and structured as the first material together with a sacrificial material 25 on top of the filling material 22, as shown in FIG. 5A. Likewise in this embodiment, the sacrificial material 25 may for example be a resist material that is not removed after structuring the filling material 22.

FIG. 5B shows the structure after deposition of the metallic material 20 as the second material in particular on exposed parts of the surface of the substrate, such that the thickness of the metallic material 20 corresponds to the thickness of the filling material 22.

FIG. 5C shows the result after removal of the sacrificial material 25 through a lift-off process, for instance, forming the planarized first layer as basis for the planarized ESL of the ESL material 23 on top of the first layer.

Figure 6A:
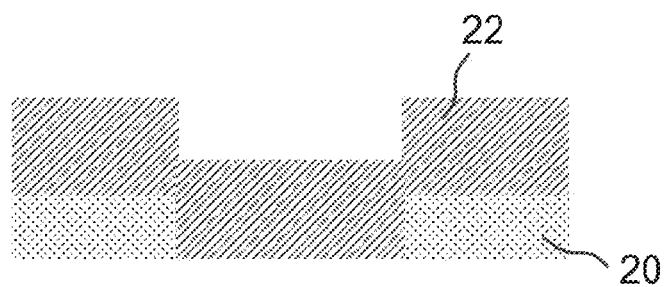
FIGS. 6A to 6D show a further exemplary embodiment of the method according to the improved concept.
Figure 6A:
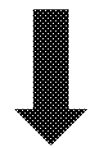

FIGS. 6A to 6D show a further alternative embodiment of the method to form the planarized ESL on top of the planarized first layer. Analogous to the process described in FIGS. 1A and 2A, the filling material 22 in this embodiment is deposited on the structured metallic material 20 and exposed parts of the surface of the substrate, in particular to fill gaps in the layer comprising the metallic material 20, as shown in FIG. 6A.

Figure 6B:
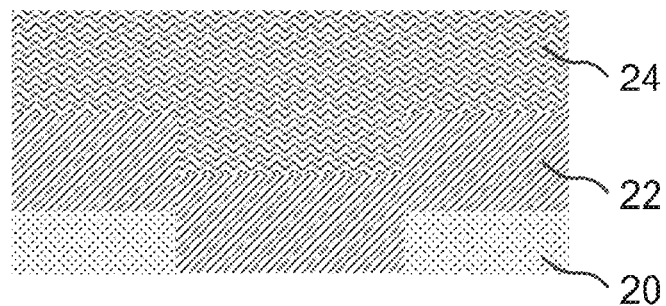
Figure 6B:
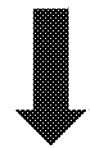

Following this, FIG. 6B shows the deposition of an additional material 24 on top of the filling material 22 such that the top surface of the additional material 24 is planar. For example, the additional material may be a resist which is applied with a planar top surface via spin-coating, for instance.

Figure 6C:
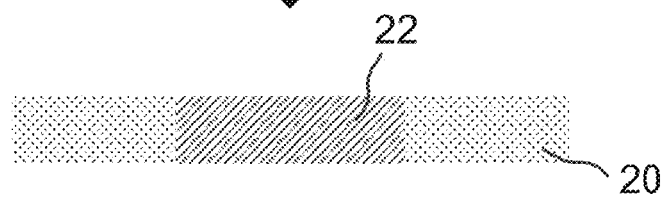
Figure 6C:
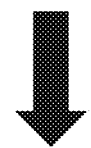
Figure 6D:
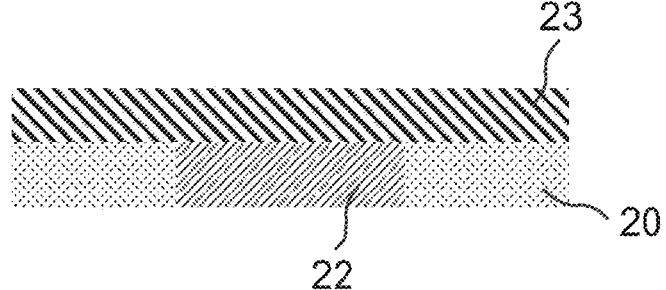

FIG. 6C shows the planarized first layer after non-selective plasma etching. This etching intends to etch the filling material 22 as well as the additional material 24 with similar, in particular equal, rates in order to achieve a planarized surface of the first layer. The plasma etch can be well-controlled such that an overetch is prevented.

FIG. 6D again shows the structure after depositing the ESL material 23 to form the planarized ESL on top of the planarized first layer.

FIGS. 7A to 7D show exemplary steps after forming the planarized ESL for fabricating a MEMS sensor comprising a planarized ESL.

Figure 7A:
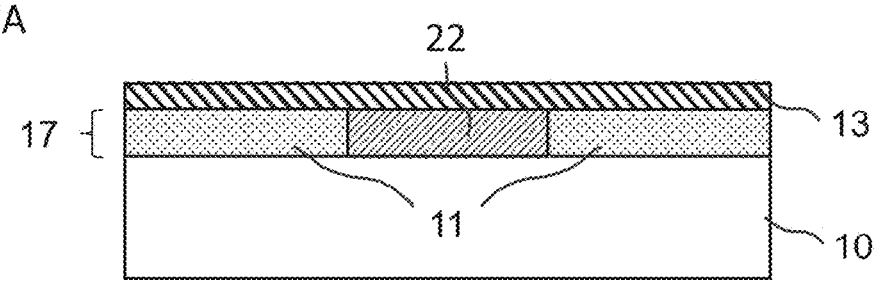
FIGS. 7A to 7D show an exemplary embodiment of the method according to the improved concept finalizing the manufacturing of the sensor.

Starting point is FIG. 7A, which shows the planarized ESL 13 of the ESL material 23 on top of the planarized first layer comprising bottom electrodes 11 of the metallic material 20 and filling material 22 in gaps between the bottom electrodes 11. The first layer is arranged on top of a surface of a substrate 10, for example a CMOS substrate with vias in the passivation for electrical connections.

Figure 7B:
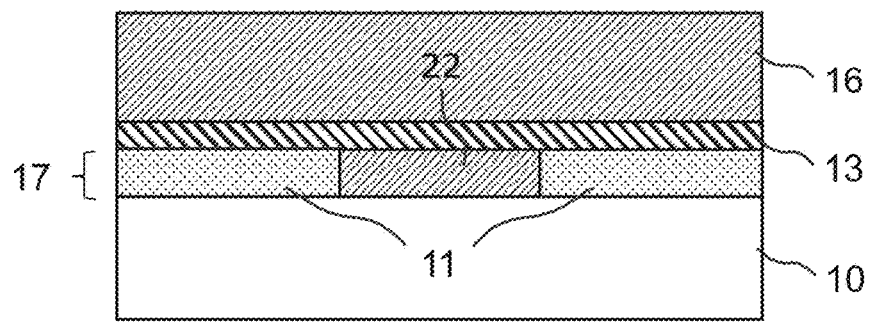

FIG. 7B shows the structure after deposition of a planarized sacrificial layer 16 of a further material. The further material has a high etch rate compared to the ESL material 23 regarding an HF vapor phase etchant. For instance, the further material may be the same as the filling material 22, in particular SiO2. SiO2 is characterized by a high selectivity over SiN regarding a HF etchant. SiN, in particular silicon-rich SiN, is a suitable ESL material 23.

Figure 7C:
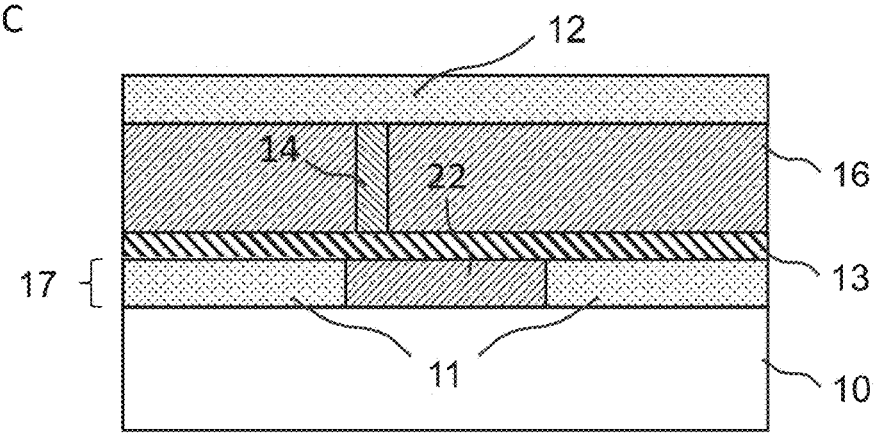

FIG. 7C shows a trench 14 inside the sacrificial layer 16. This trench is filled with a conductive anchor material, for example a metallic material, before a planarized metallic layer 12 of a second metallic material is deposited on top of the sacrificial layer 16.

Figure 7D:
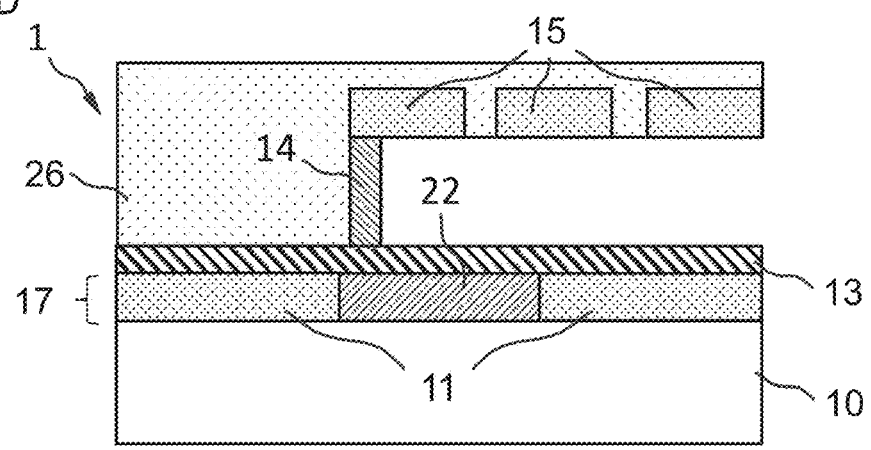

After patterning and structuring the planarized metallic layer 12 to form the top electrodes 15, the sacrificial layer 16 is removed through a HF vapor phase etching process that suspends the top electrodes 15, now forming a suspended membrane, as shown in FIG. 7D. The planarized ESL 13 acts as a barrier for the HF etch and hence stops the etching process without influencing the subjacent bottom electrodes 11, filling material 22 and the substrate 10. On top of the top electrodes 15 and the planarized ESL 13, a seal layer 26 is deposited to protect the top electrodes 15 and serve as final passivation.

The exemplary capacitive sensor 1 fabricated following this embodiment of the method according to the improved concept is a specific example and may for example be a pressure sensor. The method can be applied to similar sensor manufacturing processes, in which a planar and thin ESL is desired. This is particularly the case if the ESL remains on the finished sensor and a significant decrease of, for example, electrical properties is to be prevented.

The invention claimed is:

1. A method for manufacturing a planarized etch-stop layer, ESL, suitable for a hydrofluoric acid, HF, vapor phase etching process, the method comprising
providing a first layer with a planar surface on top of a surface of a substrate, the first layer with a planar surface comprising a patterned and structured metallic material and a filling material; and
depositing on top of the first layer with a planar surface an ESL layer with a planar surface of an ESL material, the ESL material being an etch stop material regarding HF;
wherein the ESL layer with a planar surface has a thickness of less than 150 nm;
wherein
wherein the method is part of a CMOS-compatible fabrication process
wherein the first layer with a planar surface on the substrate is provided by:
depositing a first material on top of the surface of the substrate;
patterning and structuring the first material;
depositing a second material on top of the first material, and exposed parts of the surface of the substrate; and
performing chemical-mechanical planarization, CMP; and
wherein a CMP ESL material is arranged between the first material and the second material, with the CMP ESL material being an etch stop material regarding CMP.

2. The method according to claim 1, wherein the method is suitable for manufacturing a MEMS device.

3. The method according to claim 1, wherein the ESL material is a semiconductor, or a dielectric.

4. The method according to claim 1, wherein the CMP ESL material is the same as the ESL material.

5. The method according to claim 1, wherein
the first material is the metallic material and the second material is the filling material; or
the first material is the filling material and the second material is the metallic material.

6. The method according to claim 1, wherein the method further comprises depositing a sacrificial layer with a planar surface of a further material onto the ESL layer with a planar surface, wherein the further material has a higher HF etch rate compared to the ESL material.

7. The method according to claim 6, wherein the further material is a dielectric, in particular silicon dioxide.

8. The method according to claim 6, wherein the method further comprises
forming a trench in the sacrificial layer;
filling the trench with a conductive anchor material;
depositing, patterning and structuring a second metallic material on top of the sacrificial layer;
removing the sacrificial layer; and
depositing a seal layer on top of the second metallic material and the ESL layer with a planar surface.

9. The method according to claim 8, wherein the conductive anchor material is a metal.

10. The method according to claim 6, wherein the further material is silicon dioxide.

11. The method according to claim 1, wherein the ESL layer with a planar surface has a thickness of less than 100 nm.

12. The method according to claim 1, wherein the ESL material is silicon carbide, silicon nitride, or silicon-rich silicon nitride.

13. A method for manufacturing a planarized etch-stop layer, ESL, suitable for a hydrofluoric acid, HF, vapor phase etching process, the method comprising:
providing a first planarized layer on top of a surface of a substrate, the first planarized layer comprising a patterned and structured metallic material and a filling material; and
depositing on top of the first planarized layer an ESL layer with a planar surface of an ESL material, the ESL material being an etch stop material regarding HF;
wherein the ESL layer with a planar surface has a thickness of less than 150 nm;
wherein the method is part of a CMOS-compatible fabrication process; and
wherein the first planarized layer on the substrate is provided by:
depositing a first material on top of a surface of the substrate;
depositing a sacrificial material on top of the first material;
patterning and structuring the first material and the sacrificial material;
depositing a second material on top of the structured sacrificial material and exposed parts of the surface of the substrate; and
performing wet-etching of the sacrificial material.

14. The method according to claim 13, wherein sidewalls of the structured sacrificial material are tapered.

* * * * *